(12) United States Patent
Ma et al.

(10) Patent No.: US 9,054,940 B2
(45) Date of Patent: Jun. 9, 2015

(54) SYSTEM AND METHOD FOR LINEARIZING POWER AMPLIFIERS

(71) Applicant: Mitsubishi Electric Research Laboratories, Inc., Cambridge, MA (US)

(72) Inventors: Rui Ma, Somerville, MA (US); Qiuyao Zhu, Chicago, IL (US); Koon Hoo Teo, Lexington, MA (US); Chunjie Duan, Brookline, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 14/063,543

(22) Filed: Oct. 25, 2013

(65) Prior Publication Data

US 2015/0117512 A1  Apr. 30, 2015

(51) Int. Cl.
  *H03K 7/08* (2006.01)
  *H04L 25/49* (2006.01)
  *H04B 1/04* (2006.01)

(52) U.S. Cl.
  CPC .... *H04L 25/4902* (2013.01); *H04B 2001/0425* (2013.01); *H04L 25/4917* (2013.01)

(58) Field of Classification Search
  CPC ...... H04B 1/0483; H04B 1/0607; H04B 1/52; H04B 1/04; H04B 2001/0425; H04L 25/4902; H04L 25/4917; H03F 1/0294; H03F 3/245; H03F 3/217

USPC .................. 375/219, 238, 295, 296, 297, 298
See application file for complete search history.

(56) References Cited

U.S. PATENT DOCUMENTS

| | | | |
|---|---|---|---|
| 2004/0027198 A1* | 2/2004 | Chandrasekaran et al. | .. 330/149 |
| 2006/0171484 A1* | 8/2006 | Puma | 375/295 |
| 2009/0088093 A1* | 4/2009 | Nentwig | 455/114.3 |
| 2009/0096521 A1* | 4/2009 | Liu et al. | 330/149 |
| 2010/0120384 A1* | 5/2010 | Pennec | 455/126 |
| 2011/0007838 A1* | 1/2011 | Vromans | 375/296 |
| 2013/0235923 A1* | 9/2013 | Schuberth et al. | 375/238 |

* cited by examiner

*Primary Examiner* — Syed Haider
(74) *Attorney, Agent, or Firm* — Dirk Brinkman; Gene Vinokur

(57) ABSTRACT

A power encoder includes an amplitude-phase splitter for splitting an input signal into an envelope signal and a phase modulated signal, and a pre-distortion unit for distorting the envelope signal using a look-up table (LUT) to produce a distorted envelope signal. The power encoder also includes a digital converter for combining the distorted envelope signal with the phase modulated signal to produce a distorted input signal, a pulse width modulator (PWM) for modulating the distorted input signal according to the transformation function to produce a modulated signal, and a switch mode power amplifier for amplifying the modulated signal. The look-up table stores a non-linear mapping of a transformation function and a relationship between the distorted input signal and the modulated signal is non-linear.

13 Claims, 8 Drawing Sheets

SYSTEM AND METHOD FOR LINEARIZING POWER AMPLIFIERS

RELATED APPLICATION

This application is related to co-pending U.S. patent application Ser. No. 14/063,518 entitled "Digital Power Encoder for Direct Digital-RF Transmitter," filed by Ma et al. and incorporated herein by reference.

FIELD OF THE INVENTION

The present invention relates generally to linearization of power amplifiers, and more particularly to the linearization of a multi-level digital pulse-width-modulation encoder.

BACKGROUND OF THE INVENTION

A direct digital-RF transmitter (TX) has several advantages compared to the digital-analog-RF transmitters. The direct digital-RF transmitter arranges the digital-analog interface close to the antenna, and thus fewer analog components are involved. Typical analog issues like In-phase (I) and Quadrature-phase (Q) signals mismatch, local oscillator leakage, image distortion can be largely alleviated and even avoided. The direct digital-RF transmitter also enhances system flexibility through multi-mode and multi-band operation enabled by the agile digital signal processing. In addition, the direct digital-RF transmitter is digital friendly in nature, taking advantage of the increasing speed and density of digital processing, high level integration. Thus, the direct digital-RF transmitters have benefits for both wireless base-station and mobile applications.

The direct digital-RF transmitter includes a switching mode power amplifier (SMPA), such as a class-D or class-S power amplifier, employing a particular power coding scheme, such as DSM (delta sigma modulation), PWM (pulse width modulation) and PPM (pulse position modulation) in addition with a reconstruction band-pass filter (BPF).

In order to meet the stringent linearity requirement of modern wireless communication system, most of the conventional SMPA type transmitters use delta-sigma modulator (DSM) as the power encoder. Examples of such modulators include band-pass delta-sigma modulation (BPDSM) based class-S power amplifiers. See, e.g., U.S. 2003/0210746, U.S. 2006/0188027, EP 2063536, and U.S. Pat. No. 7,825,724. The DSM is a noise shaping function with feedback loops, which can increase the in-band noise to the out-of-band spectrum. The in-band signal-to-noise ratio (SNR) can be greater than 60 dB.

Although the high in-band SNR is desired, the near band quantization noise can increase abruptly. Therefore, an extremely high quality factor (Q) band-pass filter (BPF) is required to let the filtered RF signal meet the spectrum emission mask. Furthermore, the DSM based direct digital-RF transmitter can cause the overall power inefficiency, due to the low power coding efficiency of the power encoder.

In terms of power, the radio frequency (RF) power amplifier (PA) consumes the most energy in the transmitter. A main advantage of this transmitter is that, the SMPA is always between ON (saturated) and OFF (cut-off) operating region, achieving high peak efficiency. However, if non-constant envelope signals, which are common for $3^{rd}$ generation (3G) and $4^{th}$ generation (4G) cellular mobile communication systems, are encoded into the single bit digitized signals, the in-band power over the entire digitized signal power, defined as the power coding efficiency, is low, because the generation of quantization noise is inevitable and widely spread throughout the frequency domain due to the noise shaping function, which is required from the system linearity specification. Because this noise signal is also amplified by the SMPA, the unwanted noise power becomes wasteful, which causes both excessive power loss and total TX efficiency degeneration.

The low power coding efficiency origins from the noise shaping in delta sigma power coding scheme. Thus, some conventional coding schemes use various pulse-width modulation (PWM) techniques to address the power coding efficiency. For example, some new high-efficiency power coding schemes based on the PWM include RFPWM and 3-level polar PWM architecture. Because of the inherent nonlinearity of the PWM quantization, the linearity performance degrades in the encoder. Both power coding schemes are built with analog high speed comparators, which use the higher frequency of triangular or saw-tooth waveform as the reference signal to be compared. Due to the time varied threshold voltages, it is very demanding to build associated pre-distorted blocks for both schemes.

EP2575309 discloses a pre-emphasis linearization block for a 3-level PWM power coding scheme. The pre-emphasis block uses an inverse function of the transfer function of the RFPWM power coding. The output of the pre-emphasis block is submitted to the input of the RFPWM encoder. Ideally, the pre-emphasis can correct the nonlinearity by the RFPWM encoder. However, this is possible only when the inverse function exists and can be analytically derived.

For example, the system of EP2575309 uses relatively simple 3-level PWM, so the inverse function can be determined. However, for more than 3-level, e.g., 5-level RFPWM encoding, the transfer function can become so complicated that no solution can be derived for its inverse function, which leads the difficulty to build the pre-emphasis block. Therefore, this method is not suitable for high frequency transmissions requiring complex encoding.

Hence, there is a demand for a new linearization method, particularly for the multi-level high power coding efficiency power encoder.

SUMMARY OF THE INVENTION

One objective of some embodiments of the invention is to compensate the linearity of the direct digital-RF transmitter, e.g., to meet the specification for wide bandwidth high peak-to-average power ratio (PAPR) wireless communication signals. It is a further objective to provide a look-up-table (LUT) based digital pre-distortion (DPD) to the power encoder in the direct digital-RF transmitter.

Some embodiments of the invention are based on recognition that a transformation function of a pulse width modulator (PWM) is nonlinear, but the input data have to be mapped linearly by the power encoder. Furthermore, the nonlinearity of the mapping depends on the transformation function and cannot always be determined analytically.

Some embodiments are based on a realization that the nonlinearity of the mapping can be determined experimentally by applying the transformation function to the data and building a mapping, e.g., a look a look-up-table (LUT), between the data inputted to the power encoder and the data outputted by the power encoding. It is further realized that it is possible to pre-distort the input signal based on the predetermined nonlinearity mapping, such that the transformation function of PWM transforms the pre-distorted signal to the values linear to the input signal.

Advantageously, the embodiments have no restriction for the level and other complexity of the power encoder. For example, one embodiment of the invention can be employed by a multi-level PWM with at least five levels.

Accordingly, one embodiment discloses a power encoder, which includes an amplitude-phase splitter for splitting an input signal into an envelope signal and a phase modulated signal; a pre-distortion unit for distorting the envelope signal using a look-up table (LUT) to produce a distorted envelope signal, wherein the look-up table stores a non-linear mapping of a transformation function; a digital converter for combining the distorted envelope signal with the phase modulated signal to produce a distorted input signal; a pulse width modulator (PWM) for modulating the distorted input signal according to the transformation function to produce a modulated signal, wherein a relationship between the distorted input signal and the modulated signal is non-linear; and a switch mode power amplifier for amplifying the modulated signal.

Another embodiment discloses a method for modulating data using a multi-level pulse width modulator (PWM). The method includes distorting input signal using a look-up table (LUT) storing a non-linear mapping of a transformation function to produce a distorted input signal; modulating the distorted input signal with the PWM according to the transformation function to produce a modulated signal; and amplifying the modulated signal.

In some variations of this embodiment, the distorting includes determining a set of thresholds for the PWM based on a probability density function (PDF) of a portion of the input signal; determining the transformation function according to the set of thresholds; determining the LUT by applying the transformation function to the input signal; and determining the distorted input signal using a backward mapping of data points the input signal using the LUT, such that each data point of the distorted input signal equals to an input to the transformation function corresponding to an output of the transformation function that is equal to the data point of the input signal. If necessary, the distorting can be repeated for a set of frames of the input signal.

DETAILED DESCRIPTION OF THE PREFERRED EMBODIMENTS

Advanced switch-mode power amplifiers (SMPAs), e.g. class-S amplifiers, have become one of the key power amplifier architectures. The benefits of high theoretical power efficiency and operational flexibility can enable next generation direct digital-radio frequency (RF) transmitter (TX) in software-defined radio (SDR).

The direct digital-RF transmitter utilizes class-S amplifiers to amplify a high speed pulse-train generated via a power encoder, like delta sigma modulator (DSM), pulse width modulator (PWM), or pulse position modulator (PPM). Usually a high-Q (>500) bandpass filter (BPF) is used to reconstruct the signal back to analog RF. Notably, with the recent advancement of Gallium nitride (GaN) RF transistor technology, this architecture is gaining more attention, in particular for pico-/macro-base station cellular applications.

The pulse width modulators (PWM) are used for switching amplifiers, e.g., for highly efficient switching power amplifiers used for the amplification of radio signals to be transmitted over an air interface in a wireless or wired communication network. In principle, the PWM allow for an ideal conversion of signals with continuous amplitude and limited bandwidth to a time continuous signal.

However, the PWM are inherently nonlinear, which result in the distortion of the modulated signal. Thus, in order to maintain the required integrity/linearity of the signals, especially for suppressing the in-band noise floor and out-of-band image replicas, some embodiments of the invention pre-distort the data signal before its quantization.

Figure 1A:
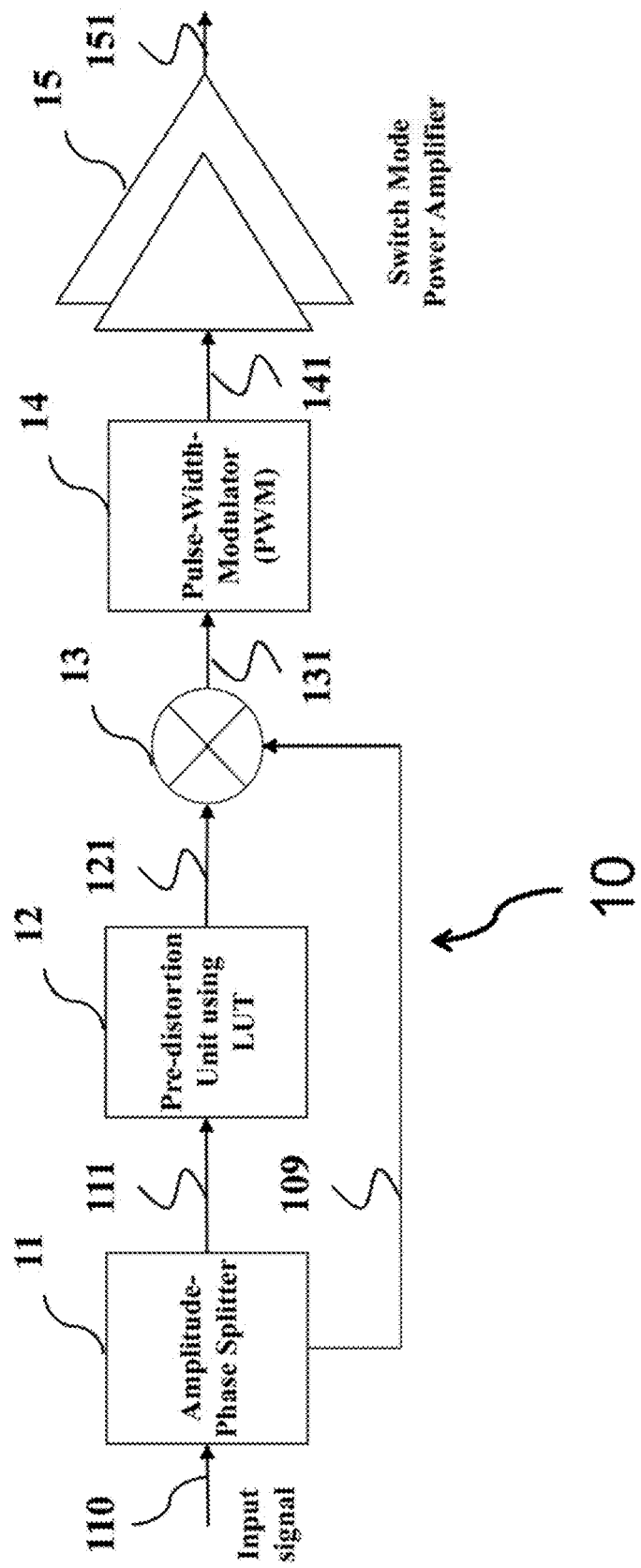
FIG. 1A is a block diagram of a power encoder employing linearization according to some embodiments of the invention.

FIG. 1A shows a schematic 10 of power encoder with pre-emphasis linearization according to some embodiments of the invention. An amplitude-phase splitter 11 splitting an input signal 11 into an envelope signal 111 and a phase modulated signal 109. The envelope signal 111 represents amplitudes of the input signal, and the phase modulated signal 109 represents phases of the input signal. A pre-distortion unit 12 distorts the envelope signal 111 using a look-up table (LUT) to produce a distorted envelope signal 121.

Some embodiments of the invention are based on a recognition that a transformation function of PWM is nonlinear, but the input signal, e.g., an envelope signal, have to be mapped linearly by the power encoder. Furthermore, the nonlinearity of the mapping depends on the transformation function and cannot always be determined analytically.

Some embodiments are based on a realization that the nonlinearity of the mapping can be determined experimentally by applying the transformation function to the input data and building a mapping, e.g., LUT, between the data inputted to the power encoder and the data outputted by the power encoding. It was further realized that it is possible to pre-distort the input data based on the predetermined nonlinearity mapping, such that the transformation function of PWM transforms the pre-distort data to the value linear to the input data. To that end, the look-up table stores a non-linear mapping of a transformation function used by pulse width modulator (PWM) 14 for the modulation, as described in more details below.

Because only amplitudes of the input signal have to be corrected, a digital converter 13 combines the distorted envelope signal 121 with the phase modulated signal 109 to produce a distorted input signal 131. Next, the PWM 14 modulates the distorted input signal according to the transformation function to produce a modulated signal 141 and a switch mode power amplifier (SMPA) 15 amplifies the modulated signal 141 to produce a power encoded signal 151. A relationship between the distorted input signal and the modulated signal is non-linear. However, because the distorted input signal was distorted based on the transformation function of the PWM, the relationship between the original input signal and the modulated signal is substantially linear.

In one embodiment, the PWM is a radio frequency (RF) PWM (RFPWM), and the digital converter up-converts the distorted envelope signal and the phase modulated signal with an RF carrier signal, such that the modulated signal is an RF pulse train. In alternative embodiment, the PWM is an intermediate frequency (IF) PWM (IFPWM), and the digital converter up-converting the distorted envelope signal and the phase modulated signal with an IF carrier signal, such that the modulated signal is an IF pulse train. This embodiment can also include a second digital up-converter for converting the IF pulse train to a radio frequency (RF) pulse train and for submitting the RF pulse train to the SMPA.

Figure 1B:
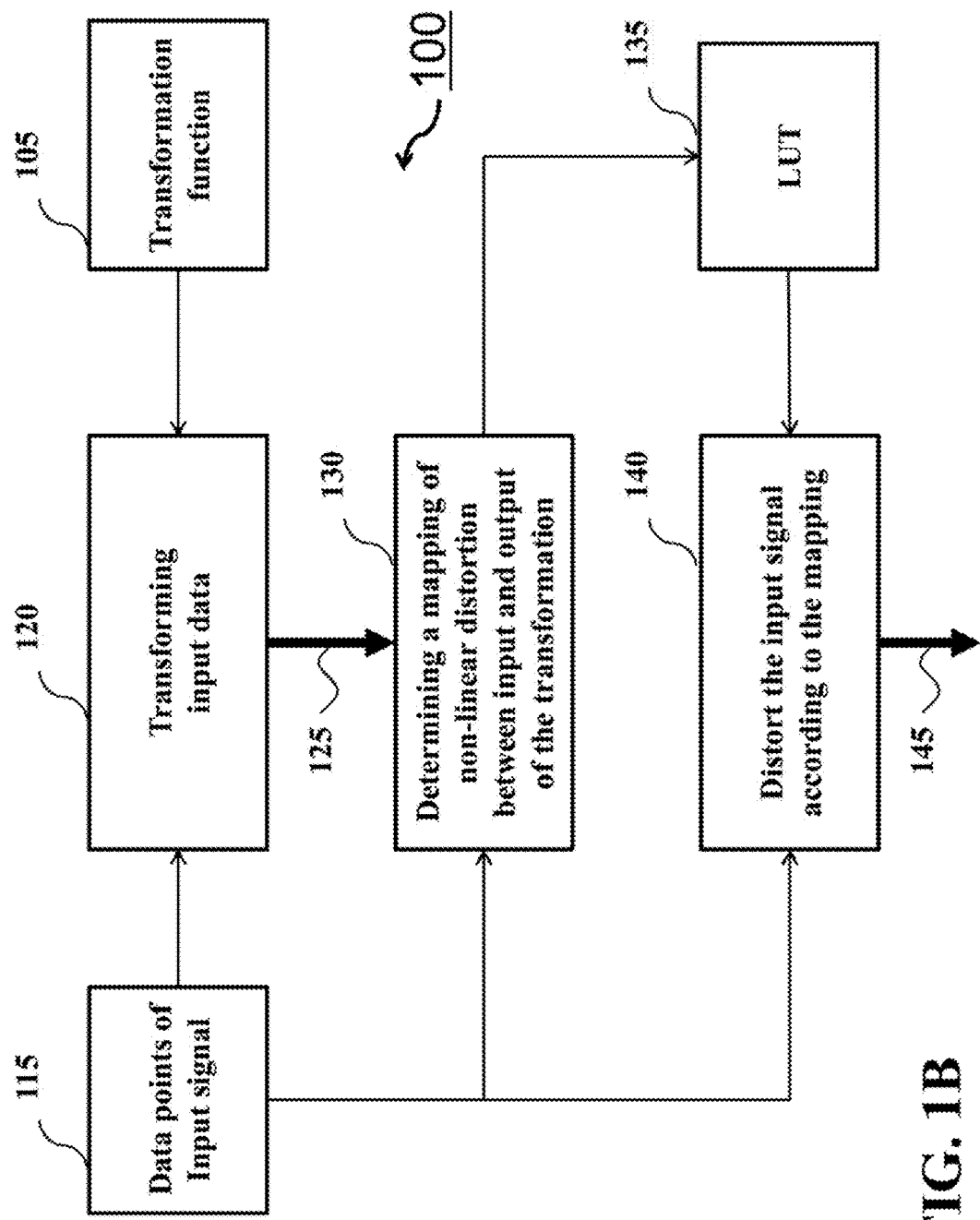
FIG. 1B is a block diagram of a pre-emphasis linearization method according to some embodiments.

FIG. 1B shows a block diagram of a pre-emphasis linearization method according to some embodiments. The method can be performed by a processor 100. The mapping, e.g., the LUT 135, is determined 130 using a forward mapping by applying the transformation function to a set of input data points. For example, the processor applies 120 the transformation function 105 to the set of data points 115 of the input to produce output data 125. The transfer function can be the amplitude-to-amplitude (AM-AM) transfer function. The LUT 135 is determined 130 as a mapping between the input 110 and the output 125 of the trans formation.

In contrast, the distorted data is determined by a backward mapping of the data point of the envelope signal by selecting 140 using the LUT 135 an input to the transformation function corresponding to an output of the transformation function that is equal to the data point of the envelope signal.

For example, the input data received for processing by the power encoder are distorted 140 using the LUT 135 to produce the distorted data. The distorted data 145 is subsequently encoded by the power encoder to produce encoded data that are linear with the input data. The backward mapping is performed for a set of data points of the input signal, such that each data point of the distorted input signal 145 equals to an input to the transformation function corresponding to an output of the transformation function that is equal to the data point of the input signal.

Figure 1C:
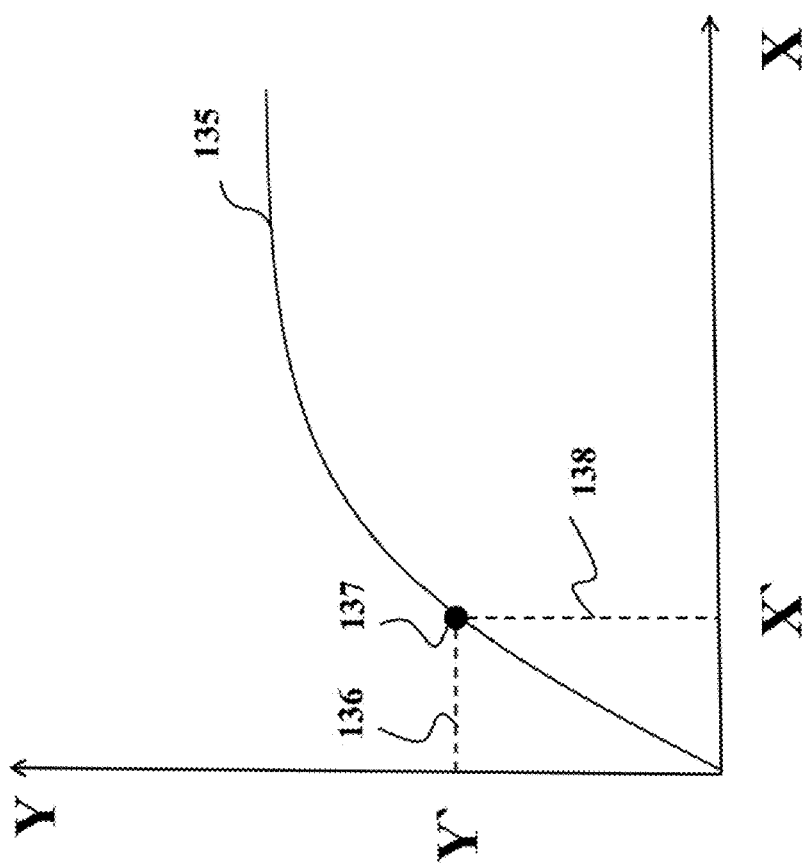
FIG. 1C is an example of a linearization mapping according to one embodiment.

FIG. 1C shows an example of the backward mapping using the LUT 135 according to one embodiment. The LUT 135 maps the input X with the output Y of the transformation. Various embodiments of the invention use the LUT 135 to pre-distort the input signal before the power encoding. For example, the data point y' 136 of the envelope signal is mapped 137 to the value x' 138. The value 138 is the pre-distorted value of the corresponding data point of the distorted envelope signal and is modulated with an aim to produce the linear mapping between the data point 136 of the envelope signal and the corresponding point of the modulated signal.

Figure 2:
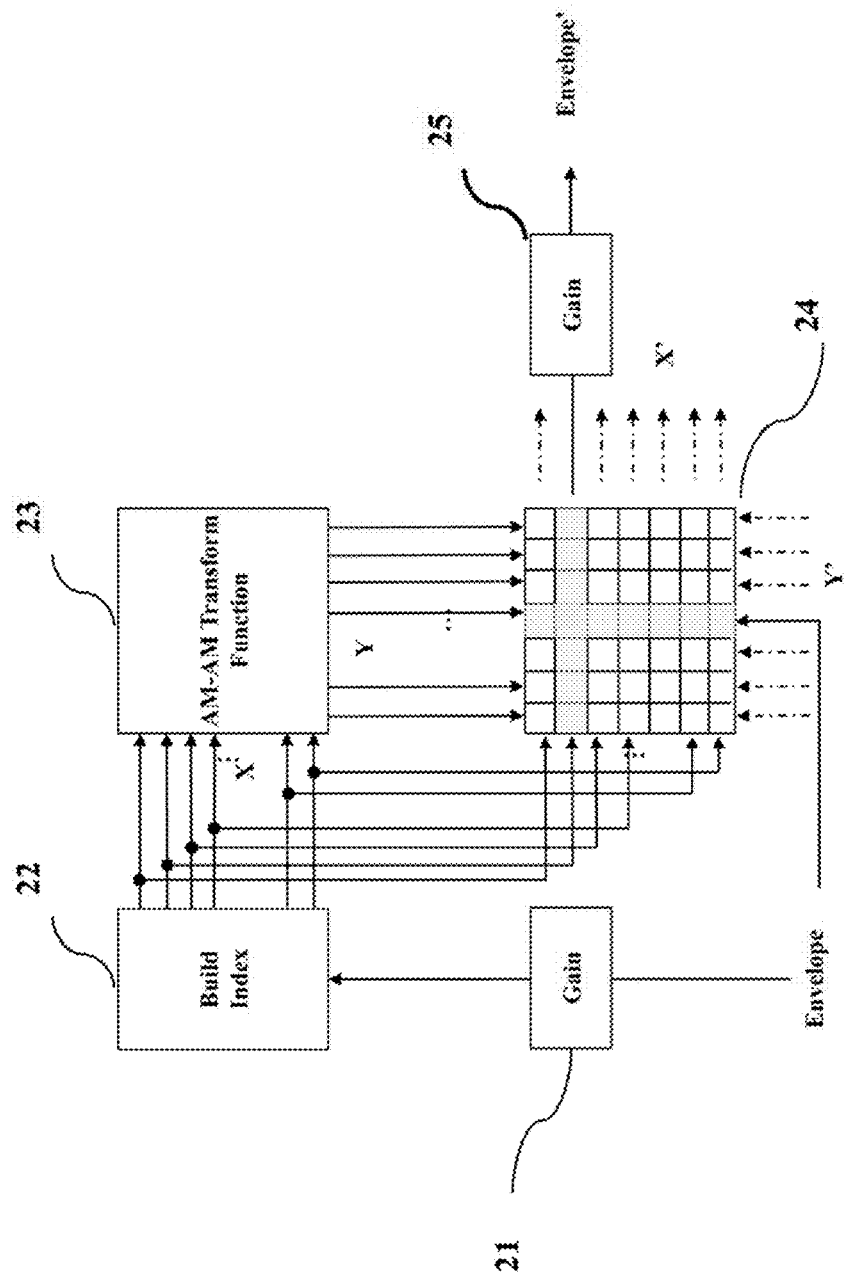
FIG. 2 is a block diagram of building and searching look-up table.

FIG. 2 illustrates a diagram of a method for determining the look-up table (LUT) 24 according to some embodiments of the invention. In some embodiments the LUT 24 is determined adaptively for each portion of the input signal, e.g., a frame. In order to build the LUT 24, the AM-AM transfer function 23 of the multi-level quantizer needs to be derived first. For a general (2N+1)-level quantizer, the amplitude-to-amplitude (AM-AM) transfer function, can be $$f(a(t)) = \frac{1}{N}\sum_{i=1}^{N} \cos\left[\sin^{-1}\left(\frac{V_{thi}}{a(t)}\right)\right], a(t) \geq V_{thN} \quad (1)$$

where $a(t)$ is the envelope of the input data, and $V_{thi}$ is the $i^{th}$ threshold value, $V_{thi} < V_{thj}$ when $1 \leq i < j \leq N$.

Next, the embodiments index the discrete LUT. The output vector Y is the result calculated from the AM-AM function with the defined input vector X, e.g., from $V_{th1}$ to 1 with the fixed step, e.g. 0.001. This procedure is accomplished by building the index 22 after the normalization 21 of the envelope. Now, the LUT 24 is reversely search with the envelope input Y' to select the closest pre-distorted output X'. Another gain block 25 can re-normalize the pre-distorted output to be the input of the following power encoder.

The LUT 24 can be composed to describe the inverse behavior of the nonlinearity of the encoder, which is described in Equation (1). Pre-distortion procedure can be imposed according to the searched LUT value. This LUT searching algorithm has in theory no limitation on the number of quantization level, which is an advantage over the analytical inverse function based pre-distortion scheme.

Figure 3:
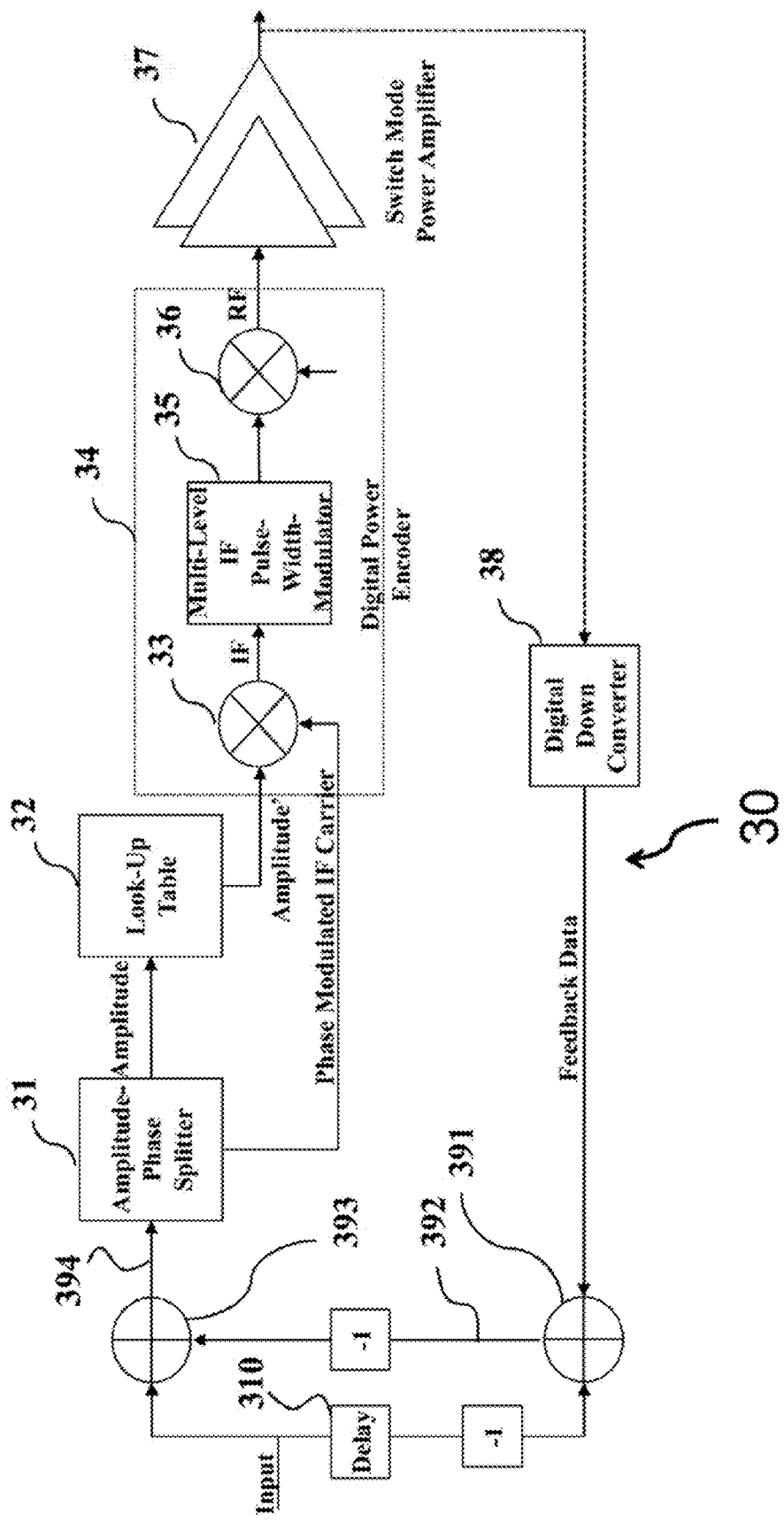
FIG. 3 is a circuit schematic of this direct digital-RF transmitter linearization method based on look-up table as depicted in FIG. 2.

FIG. 3 shows a block diagram of a method for considering SMPA nonlinearity according to an embodiment of this invention. A direct digital-RF transmitter linearization method 30 includes the linearization of both multi-level power encoder 35 and switch mode power amplifier (SMPA) 37. A primary portion of this transmitter distortion correction is realized by the high speed digital logic integrated circuit (preferably ASIC), which includes two adders 39, amplitude-phase splitter 31, look-up table 32, digital encoder 34 and digital down converter (DDC) 38. Within the digital encoder 34, there are two frequency up-converters 33 and 36, and a multi-level intermediate frequency (IF) pulse-width-modulator (ML-IFPWM) 35.

Some embodiments of the invention are based on a realization that by decreasing the PWM input carrier to an intermediate frequency (IF), and then encoding the IF signals by a pulse-width-modulator, the time domain quantization is extended and a magnitude of the quantization increased. Thus, the accessible clock rate of current digital processors can implement this power coding algorithm and the direct digital output to switch-mode power amplifiers (SMPA) becomes realizable.

The first up-converter 33 converts the pre-distorted envelope to an IF, then feeds the ML-IFPWM 35. The encoded result is further up-converted to radio frequency (RF) by the second up-converter 36. In the preferred embodiment transmitter 30, the power amplifier 37 is a switching power amplifier (preferably class-S PA module) that accepts a multi-level pulse train as an input, and amplifies the high-speed pulse train signal including the necessary in-band information.

Part of the SMPA 37 output is coupled and digitized back to the digital down converter (DDC) 38, which down converts the RF signal back to the baseband as the feedback data. The input data can be aligned with the feedback through a delay block 310. The lower combiner 391 determines the error data 392 that are subtracted from the input data in advance by the upper combiner 393 to produce the corrected data 394. This feedback loop corrects the distortion of the switch mode power amplifier (SMPA) 37. The envelope of the corrected data is calculated by the amplitude-phase splitter 31 (preferably a CORDIC unit). The block look-up table 32 pre-distorts the envelope to correct the distortion of the ML-IFPWM 35.

Figure 4A:
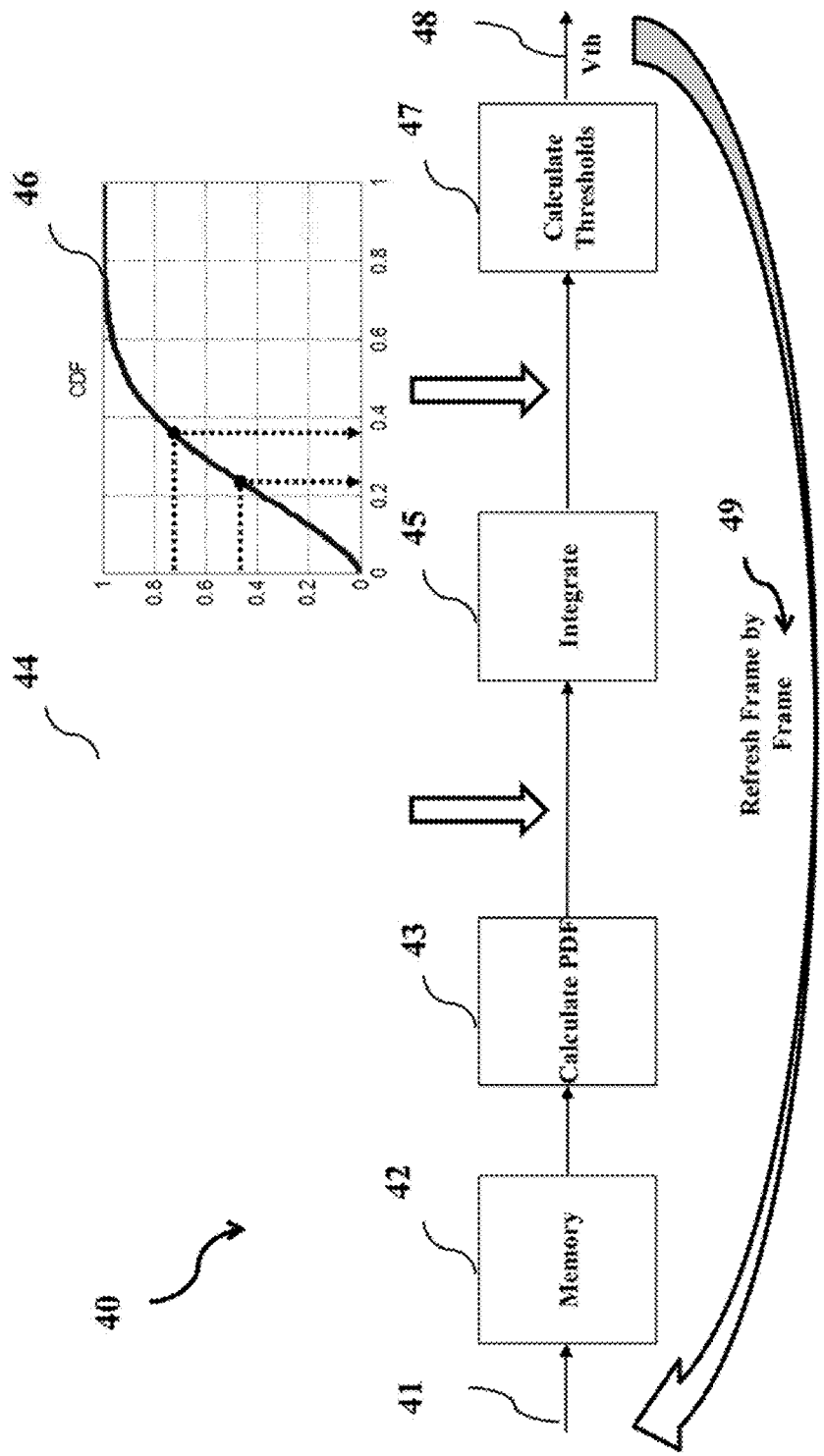
FIG. 4A is a schematic of determining the set of fixed thresholds according to some embodiments of the invention.

FIG. 4A shows a schematic of a method for determining the set of fixed thresholds, which is adaptive to each transmitted frame or subframe according to some embodiments of the invention. The method can be implemented by a processor 40 connected to a memory 42. The baseband input data 41 of a frame are stored in a memory 42 as vectors or arrays. Then, the processor 40 determines 43 the probability density function (PDF) 44 from data in the frame. The PDF is integrated 45 to generate a curve 46 of the cumulative distribution function (CDF). From the CDF curve 46, a set of threshold values 48 are selected, e.g., the CDF curve is equally spaced. This process is adaptively repeated 49 frame by frame to ensure the set of thresholds 48 remains optimized.

Figure 4B:
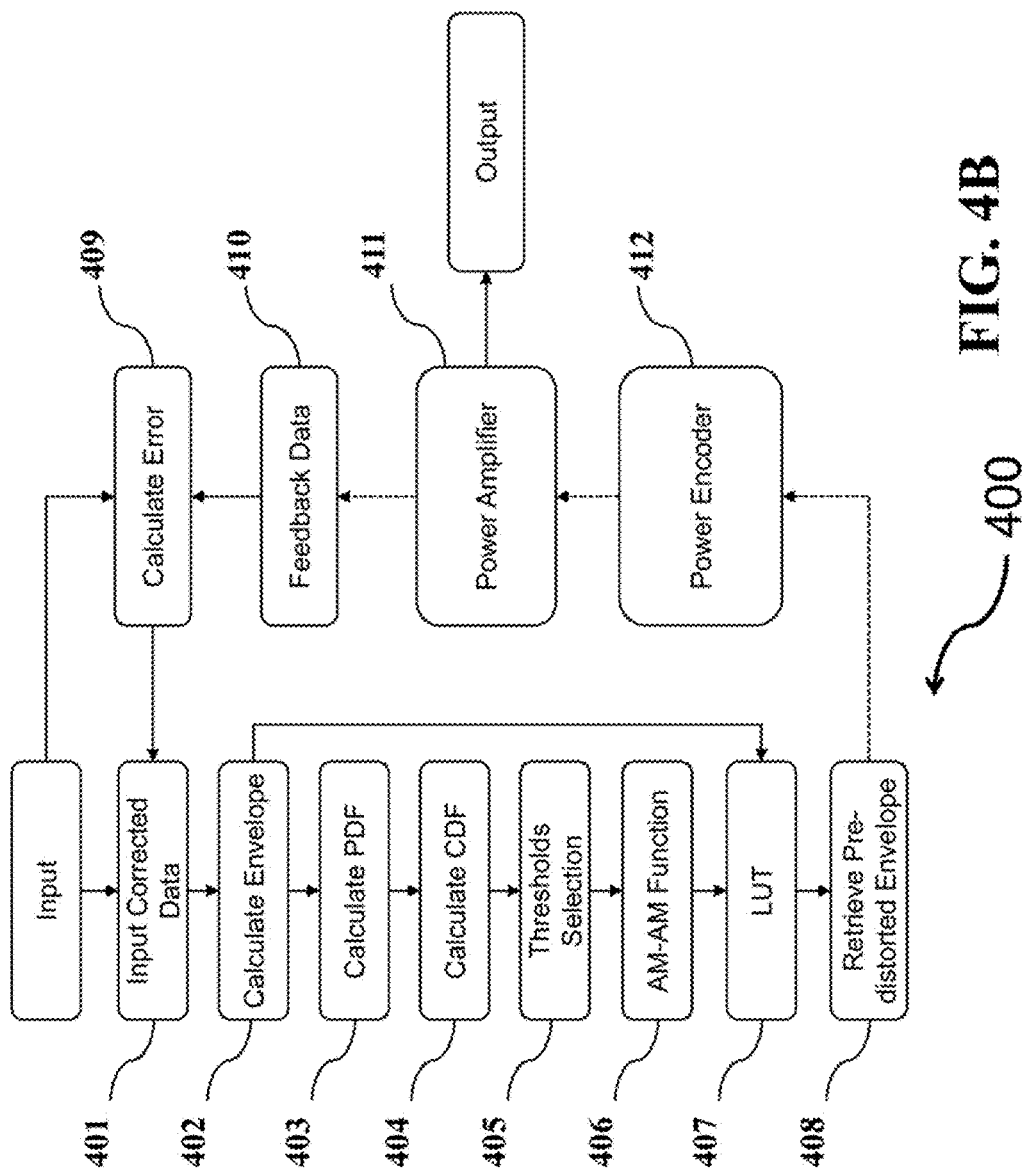
FIG. 4B is a flow chart of this direct digital-RF transmitter linearization method.

FIG. 4B shows a flow chart 400 of the linearization method according to another embodiment of the invention. The embodiment determines 401 the corrected data by subtracting the input data and the error 409 determined using a feedback 410 and extracts 402 the envelope of the corrected data. The probability density function (PDF) 403 and the cumulative distribution function (CDF) 404 of the envelope are determined. Given the CDF, a set of threshold values for each quantization levels is selected 405 from the CDF curve. The AM-AM transfer function 406 and the LUT 407 are determined as described above, and used to pre-distort 408 the envelope of the input data through searching the LUT 407. The steps are adaptively repeated frame by frame to ensure the power coding efficiency is always optimized. The power encoder 412 encodes the pre-distorted data and output to the power amplifier 411 for transmitting. A small portion of power can also be fed back 410 to calculate the distortion error due to the power amplifier 411.

Figure 5:
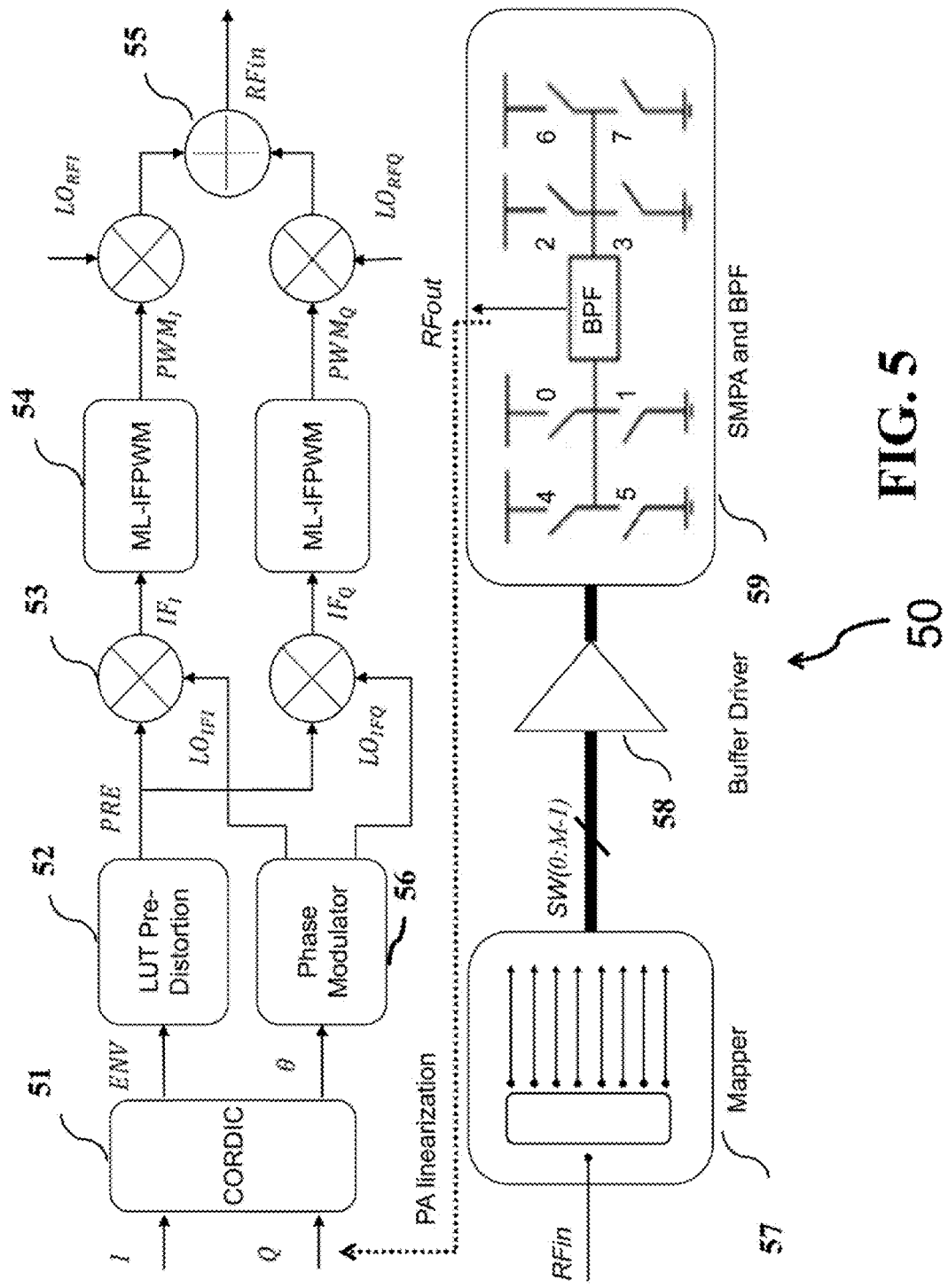
FIG. 5 is a block diagram of the direct digital-RF transmitter according to some embodiments of the invention.

FIG. 5 shows a block diagram of the direct digital-RF transmitter 50 according to some embodiments. In these embodiments, a pre-distortion block based on a LUT is arranged before the encoder to further compensate the linearity. After the encoder, a 4-phase LO is employed to up-convert the IF IQ signal into RF band. Hence, this embodiment is a two-stage digital up-conversion at a reduced sampling rate. Because this is a pipeline architecture, the embodiments can use a parallel implementation to increase the sampling rate for higher time domain quantization to achieve the desired linearity.

The input data are complex and includes both In-phase (I) and Quadrature-phase (Q) paths. The complex input is processed by a coordinate rotation digital computer (CORDIC) block 51 to convert the Cartesian data to polar data (i.e., envelope (ENV) and phase θ). A LUT pre-distortion unit 52 is enabled to pre-distort the ENV for linearity correction of the nonlinear ML-IFPWM 54 power encoder. The output is noted as PRE. The phase modulator 56 generated the phase modulation (PM) IQ signal ($LO_{IFI}$ and $LO_{IFQ}$) at the IF carrier frequency (e.g., 100-MHz for LTE application). Two IF digital up-converters (DUCs) 53 mix the PRE with $LO_{IFI}$ and $LO_{IFQ}$, respectively.

The output of the IF DUCs 53 $IF_I$ and $IF_Q$ are encoded by two ML-IFPWM power encoders 54, e.g., shown in FIG. 3. The generated pulse trains are $PWM_I$ and $PWM_Q$. Another set of digital up-converters mix $PWM_I$ and $PWM_Q$ with $LO_{RFI}$ $\{1, 0, -1, 0, \ldots\}$ and $LO_{RFQ}$ $\{0, 1, 0, -1, \ldots\}$, respectively. The products are added by the combiner 55 to output $RF_{in}$. (i.e., $RF_{in} = PWM_I \cdot LO_{RFI} + PWM_Q \cdot LO_{RFQ}$) and then a mapper 57 converts the multi-level $RF_{in}$ into the control bits signal.

Usually, a (2M−1)-level pulse train need M control bits, for instance, 2 bits for 3-level and 3 bits for 5-level IFPWM signal. The M control bits are binary switching signal SW(0:M−1) to control the switches (e.g., using GaN transistors) of the power amplifier (e.g., class-S PA) in 59. To fit the multi-bits input, the power amplifier can be configured in H-bridge for 3-level signal, or the paralleled H-bridge for 5-level signal.

There can be also a feedback from the output of the power amplifier. The feedback couples a small amount of power back to the input for characterizing the nonlinearity introduced by the power amplifier. Before the power amplifier, a buffer driver 58 is required to synchronize the multi-bits input and also provide some amplification to reach the power amplifier's input power requirement. Within 59, a bandpass reconstruction filter (BPF) can also be included in the SMPA module for filtering the out-of-band quantization noise in order to transmit the clean analog $RF_{out}$, and, e.g., the BPF or another additional designed energy recycling block (e.g. Broadband RF-DC rectifier) can recycle RF power associated with those undesired spectral components back to the SMPA DC supply. The $RF_{out}$ is suitable for transmission by an antenna. Other conventional transmitter and receiver components can also be used, e.g., an isolator to eliminate the effect of power reflections.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A power encoder, comprising:
   an amplitude-phase splitter for splitting an input signal into an envelope signal and a phase modulated signal;
   a pre-distortion unit for distorting the envelope signal using a look-up table (LUT) to produce a distorted envelope signal, wherein the look-up table stores a non-linear mapping of a transformation function, wherein the pre-distortion unit selects a distorted data point of the distorted envelope signal using the LUT, such that a value of the distorted data point transformed with the transformation function is linear to a corresponding data point of the envelope signal, and wherein the LUT is determined using a forward mapping by applying the transformation function to a set of input data points, and wherein the distorted data point is determined by a backward mapping of the data point of the envelope signal by selecting an input to the transformation function corresponding to an output of the transformation function that is equal to the data point of the envelope signal;
   a digital converter for combining the distorted envelope signal with the phase modulated signal to produce a distorted input signal;
   a pulse width modulator (PWM) for modulating the distorted input signal according to the transformation function to produce a modulated signal, wherein a relationship between the distorted input signal and the modulated signal is non-linear; and
   a switch mode power amplifier for amplifying the modulated signal.

2. The power encoder of claim 1, wherein the PWM is a radio frequency (RF) PWM (RFPWM), and the digital converter up-converting the distorted envelope signal and the phase modulated signal with an RF carrier signal, such that the modulated signal is an RF pulse train.

3. The power encoder of claim 1, wherein the PWM is an intermediate frequency (IF) PWM (IFPWM), and the digital converter up-converting the distorted envelope signal and the phase modulated signal with an IF carrier signal, such that the modulated signal is an IF pulse train.

4. The power encoder of claim 3, further comprising:
   a second digital up-converter for converting the IF pulse train to a radio frequency (RF) pulse train and for submitting the RF pulse train to the switch mode power amplifier.

5. The power encoder of claim 1, wherein the PWM is at least a multi-level PWM with at least five levels.

6. The power encoder of claim 1, wherein the PWM is a multi-level PWM modulating based on a set of fixed thresholds.

7. The power encoder of claim 6, wherein each fixed threshold is based on a probability density function (PDF) of a portion of the input signal.

8. The power encoder of claim 7, further comprising
a memory for storing a frame of the distorted input signal;
a processor for determining the PDF from data in the frame, for integrating the PDF to generate a curve of a cumulative distribution function (CDF), and for selecting values of each fixed threshold based on the curve.

9. The power encoder of claim 8, wherein the processor determines, for each frame of the distorted input signal, the set of fixed threshold, the transformation function, and the LUT.

10. The power encoder of claim 1, further comprising:
a digital down converter for determining a feedback error of the switch mode power amplifier; and
a combiner for correcting the input signal with the feedback error before submitting the input signal to the pre-distortion unit.

11. A method for modulating data using a multi-level pulse width modulator (PWM), comprising:
distorting input signal using a look-up table (LUT) storing a non-linear mapping of a transformation function to produce a distorted input signal;
modulating the distorted input signal with the PWM according to the transformation function to produce a modulated signal; and
amplifying the modulated signal, wherein the distorting comprises:
determining a set of thresholds for the PWM based on a probability density function (PDF) of a portion of the input signal;
determining the transformation function according to the set of thresholds;
determining the LUT by applying the transformation function to the input signal; and
determining the distorted input signal using a backward mapping of data points the input signal using the LUT, such that each data point of the distorted input signal equals to an input to the transformation function corresponding to an output of the transformation function that is equal to the data point of the input signal.

12. The method of claim 11, further comprising:
repeating the distorting for a set of frames of the input signal.

13. A power encoder, comprising:
an amplitude-phase splitter for splitting an input signal into an envelope signal and a phase modulated signal;
a pre-distortion unit for distorting the envelope signal using a look-up table (LUT) to produce a distorted envelope signal, wherein the look-up table stores a non-linear mapping of a transformation function;
a digital converter for combining the distorted envelope signal with the phase modulated signal to produce a distorted input signal;
a pulse width modulator (PWM) for modulating the distorted input signal according to the transformation function to produce a modulated signal, wherein a relationship between the distorted input signal and the modulated signal is non-linear, wherein the PWM is a multi-level PWM modulating based on a set of fixed thresholds, wherein each fixed threshold is based on a probability density function (PDF) of a portion of the input signal;
a memory for storing a frame of the distorted input signal;
a processor for determining the PDF from data in the frame, for integrating the PDF to generate a curve of a cumulative distribution function (CDF), and for selecting values of each fixed threshold based on the curve; and
a switch mode power amplifier for amplifying the modulated signal.

* * * * *